United States Patent
Ko et al.

(10) Patent No.: US 9,692,369 B2
(45) Date of Patent: Jun. 27, 2017

(54) LOW-NOISE AMPLIFIER HAVING HIGH LINEARITY FOR MULTI-BAND

(71) Applicant: FCI INC, Gyeonggi-do (KR)

(72) Inventors: Dong Hyun Ko, Gyeonggi-do (KR); Myung Woon Hwang, Gyeonggi-do (KR)

(73) Assignee: FCI, INC, Gyeonggi-Do (KR)

( * ) Notice: Subject to any disclaimer, the term of this patent is extended or adjusted under 35 U.S.C. 154(b) by 0 days.

(21) Appl. No.: 14/936,392

(22) Filed: Nov. 9, 2015

(65) Prior Publication Data

US 2016/0373065 A1 Dec. 22, 2016

(30) Foreign Application Priority Data

Jun. 19, 2015 (KR) .................. 10-2015-0087787

(51) Int. Cl.
| | |
|---|---|
| *H03F 1/34* | (2006.01) |
| *H03F 3/193* | (2006.01) |
| *H03F 1/22* | (2006.01) |
| *H03F 3/26* | (2006.01) |

(52) U.S. Cl.
CPC ............. *H03F 3/193* (2013.01); *H03F 1/223* (2013.01); *H03F 1/342* (2013.01); *H03F 3/265* (2013.01); *H03F 2200/09* (2013.01); *H03F 2200/111* (2013.01); *H03F 2200/294* (2013.01); *H03F 2200/451* (2013.01); *H03F 2200/63* (2013.01)

(58) Field of Classification Search
CPC .................................... H03F 1/34; H03F 1/22
USPC .................................. 330/294, 311
See application file for complete search history.

(56) References Cited

U.S. PATENT DOCUMENTS

| | | | | |
|---|---|---|---|---|
| 7,274,257 | B2 * | 9/2007 | Kim .................. | H03F 1/223 330/149 |
| 7,589,593 | B2 * | 9/2009 | Lai .................... | H03F 1/223 330/295 |
| 2005/0225397 | A1 * | 10/2005 | Bhatia ............... | H03F 3/191 330/311 |
| 2008/0169877 | A1 * | 7/2008 | Banba ............... | H03F 1/223 330/306 |
| 2014/0320211 | A1 * | 10/2014 | Benson ............. | H03F 1/086 330/294 |

* cited by examiner

*Primary Examiner* — Henry Choe
(74) *Attorney, Agent, or Firm* — Kirton McConkie; Evan R. Witt

(57) ABSTRACT

The present invention discloses a low-noise amplifier having a characteristic of high linearity for multi-band. Embodiments of the present invention is to provide a low-noise amplifier (LNA), which realizes a balun function and a preamplifier function of mixer in the low-noise amplifier (LNA), and minimizes the factors reducing the linearity between the low-noise amplifier (LNA) and the mixer.

4 Claims, 5 Drawing Sheets

LOW-NOISE AMPLIFIER HAVING HIGH LINEARITY FOR MULTI-BAND

FIELD OF THE INVENTION

One embodiment of the present invention relates to a low-noise amplifier (LNA) having high linearity which is designed as a balun form for multi-band.

BACKGROUND OF THE INVENTION

The contents described below merely provide the background information relating to the embodiments of the present invention, and do not constitute the conventional technology.

With respect to low-noise amplifiers (LNA) in a mobile TV tuner environment using ISDB-T (ultra-high frequency band (UHF Band): 470 MHz to 770 MHz)/ISDB-Tmm (Very high frequency (VHF Band): 170 MHz~280 MHz)/ISDB-Tsb (Low VHF: 90 MHz to 110 MHz)/CATV (Wide-Band: 90 MHz to 810 MHz), high linearity is required to minimize the performance degradation of harmonic mixing due to frequency of 700 MHz to 2.4 GHz used under 3G or 4G and local oscillator (LO).

Conventional low-noise amplifiers (LNA) have employed technology of attenuating Jammer frequency with RF-Filter. First of all, although it is the most effective, the noise figure (NF) of the low-noise amplifier deteriorates, because the technology of using a filter at the input of low-noise amplifier (LNA) has an effect of reducing the power of jammer at the stage of input. Although there also exists a technology of adding a filter between the output of the low-noise amplifier (LNA) and the input of the mixer to avoid the deterioration of the noise figure, integration of chips from modules has become difficult since more external LCs are needed. For the method of using a filter, removal of LTE power at 700 MHz to 800 MHz has become very difficult. As the most difficult example, in case of channel of 707 MHz, removing LTE jammer power of 725 MHz by a filter has become very difficult because their frequencies are close. For instance, interference between TV channels has also become a problem. The performance of a portion where interference generates is improved as the linearity of the low-noise amplifier (LNA) becomes better. Furthermore, each of the low-noise amplifiers (LNA) used in ISDB-T/ISDB-Tmm/ISDB-Tsb/CATV needs a mixer, and there exists a problem of increasing in size due to the structure of the mixer becoming more complex.

SUMMARY OF THE INVENTION

Embodiments of the present invention are to provide a low-noise amplifier (LNA), which realizes a balun function and a preamplifier function of mixer in the low-noise amplifier (LNA), thus minimizes the factors that reduce the linearity between the low-noise amplifier (LNA) and the mixer.

One embodiment of the present invention provides a low-noise amplifier, comprising a first amplification circuit, a second amplification circuit, an RC feedback circuit, and a second capacitor ($C_2$). Wherein, the first amplification circuit includes a first amplifier ($MN_1$) and a second amplifier ($MN_2$) connected in series. The second amplification circuit includes a third amplifier ($MN_3$) and a fourth amplifier ($MN_4$) connected in series. The RC feedback circuit includes a first resistor ($R_1$) and a first capacitor ($C_1$) connected in series, and one end thereof is connected to an input terminal (RF_IN), the other end is connected to a contact point of said first amplifier ($MN_1$) with said second amplifier ($MN_2$). The second capacitor ($C_2$) has one end connected to a contact point of said first amplifier ($MN_1$) with said second amplifier ($MN_2$), and the other end connected to said third amplifier ($MN_3$). Said first amplification circuit is applied with a driving signal and outputs an amplified amplification signal; said second amplification circuit is applied with amplification signal, and output the amplified output signal.

ADVANTAGEOUS EFFECTS OF THE INVENTION

As described above, according to the embodiments, the low-noise amplifier (LNA) realizes a balun function and a preamplifier function of mixer in the low-noise amplifier (LNA), thus minimizes the factors that reduce the linearity between the low-noise amplifier (LNA) and the mixer.

According to the embodiments of the present invention, since the linearity is improved, the low-noise amplifier (LNA) has an effect that the noise figure of the entire system is not reduced due to the conventional noise figure and gain, by removing all of the conventionally used active circuit which generates non-linear component between the low-noise amplifier (LNA) and the mixer, and removing all blocks of generating non-linear component from low-noise amplifier (LNA). There is an effect that the low-noise amplifier (LNA) can even perform a pre-amplifier role at the same time, by adding functions to the balun and allowing the mixer to have a differential structure. Further, there is an effect that a simple system with a single mixer can be implemented by sharing the output of the low-noise amplifier (LNA) that supports multi-band. According to the embodiments of the present invention, there is an effect that allows to have high-linearity performance using a scheme of cancellation of IM3 (Third Inter-Modulation) in the low-noise amplifier (LNA).

According to the embodiments of the present invention, there is an effect of improving the portion with reduced linearity, and minimizing the performance deterioration with respect to the surrounding jammer power (LTE/CDMA/Jammer Channel). As to the portion with reduced linearity, it is possible to reduce the number of mixers by removing the element used as filter from outside, and sharing the output of the low-noise amplifier (LNA) to support multi-band.

DESCRIPTION OF THE EMBODIMENTS

Hereinafter, exemplary embodiments will be described in detail with reference to the accompanying drawings.

Low-noise amplifier (LNA) (100) according to one embodiment of the present invention is a low-noise amplifier (LNA) of 'balun' form which generates differential output with single input. Here, 'balun' is commonly used to represent circuit/structure which converts balanced signal to unbalanced signal, or converts unbalanced signal to balanced signal. In other words, 'balun' does not refer to particular element, but refers to all those capable of balanced-unbalanced signal converting.

Figure 1:
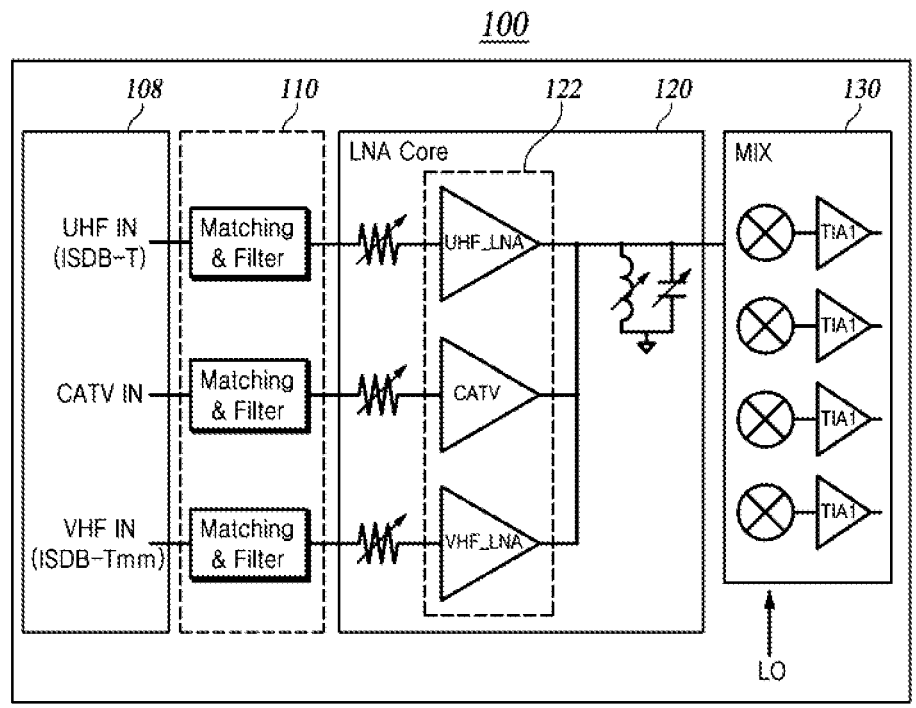
FIG. 1 is a block diagram schematically illustrating a low-noise amplifier (LNA) in accordance with one embodiment of the present invention.

FIG. 1 schematically illustrates a low-noise amplifier (LNA) in accordance with the present invention.

Low-noise amplifier (LNA) (100) in accordance with one embodiment of the present invention comprises input port (108), signal input unit (110), LNA core (120), and mixer (130). Elements included in the low-noise amplifier (LNA) are not limited thereto.

The input port (108) is provided with ports for inputting signal to a plurality of frequency ranges. For example, the input port (108) is provided with a plurality of ports such as ultra-high frequency band (UHF Band) port, CATV (Wide-Band) port, very high frequency (VHF Band). The input port (108) has an input for each of the ISDB-T/ISDB-Tmm/CATV.

The signal input unit (110) comprises a respective matching filter (matching & filters), which is associated with the input port (108). One end of the matching filter in the signal input unit (110) is connected to the input port (108) respectively, and the other end of the matching filter in the signal input unit (110) is connected to the LNA core (120).

The LNA core (120) is provided with an amplifying unit which includes a plurality of amplifying stages corresponding to each of the driving signals of multi-band input from the input terminal (RF_IN). And the plurality of amplifying stages are applied with each driving signal and output the amplified amplification signal, then applied with the amplification signal and output the amplified output signal by a differential output for outputting. LNA core (120) includes a differential LC circuit which is connected to each of the plurality of amplifying stages in parallel and used under LC load by sharing the differential output with each other. A mixer (130) is connected to the output terminal of the LC circuit, such that the linearity can be improved.

The LNA core (120) includes a variable resistor, an amplifying unit (122), a variable inductor, and a variable capacitor. Details relating to the amplifying unit (122) will be described with reference to FIGS. 3c and 3d. The LNA core (120) can use the LC load by sharing the output for the multi-bands of 'UHF_LNA', 'VHF_LNA', 'CATV_LNA' input from the input port (108). LNA core (120) is shared by differential output, wherein the mixer (130) is connected to the output of the low-noise amplifier (LNA), and the low-noise amplifier (LNA) has a structure capable of performing a role of pre-amplifier (Pre-Amplifier). With respect to the structure of the low-noise amplifier (LNA) (100), since the active circuit which generates non-linear factor is only one of the LNA core (120) blocks, the linearity function can be performed as much as possible. The LNA core (120) uses a plurality of circuit and shares an output node. The LC load is used in the shared output node, and the LNA core (120) can be used to vary the LC load.

The mixer (130) is connected to the output of the LNA core (120), to receive and mix the output of the LNA core (120). The rear end of the low-noise amplifier (LNA) (100) is shown by the mixer (130) in FIG. 1, but the low-noise amplifier (LNA) (100) is not necessarily limited thereto.

The low-noise amplifier (LNA) according to this embodiment of the present invention is a low-noise amplifier (LNA) having a function of high linearity for supporting multi-band, which is in balun form of receiving single input and providing differential output. Recently, in case of TV tuner chip under mobile environment, low-noise amplifier (LNA) with a function of high linearity is required to minimize the effect of jammer frequency of such as LTE/CDMA/adjacent channels. It is difficult to be useful for maintaining the noise figure (NF) when a balun is used to improve the function of IIP2 (Second-order Input Intercept Point) at the time of inputting, and additional cost may be also required for multi-band when necessary. Thus, it is necessary to add an additional circuit for converting single output to a differential by employing a low-noise amplifier which receives a single input and generates a single output. A circuit, which creates a differential with single output, typically shares and uses a pre-amplifier for driving the mixer, such that a degradation of IIP3 (Third-order Input Intercept Point) at the portion where the pre-amplifier is shared will happen. Therefore, this embodiment of the present invention provides a structure which can use the low-noise amplifier (LNA) as a balun function and a pre-amplifier for driving the mixer at the same time, to reduce the degradation of linearity as much as possible, and exhibit a high linearity. Furthermore, in the case of requiring a low-noise amplifier (LNA) which supports multi-band such as band of UHF (470 MHz to 810 MHz) or VHF (170 MHz to 280 MHz), or wide-band frequency of CATV (90 MHz to 810 MHz) and the like, there is a structure for supporting applications by combining in one output and using only one mixer.

Figure 2:
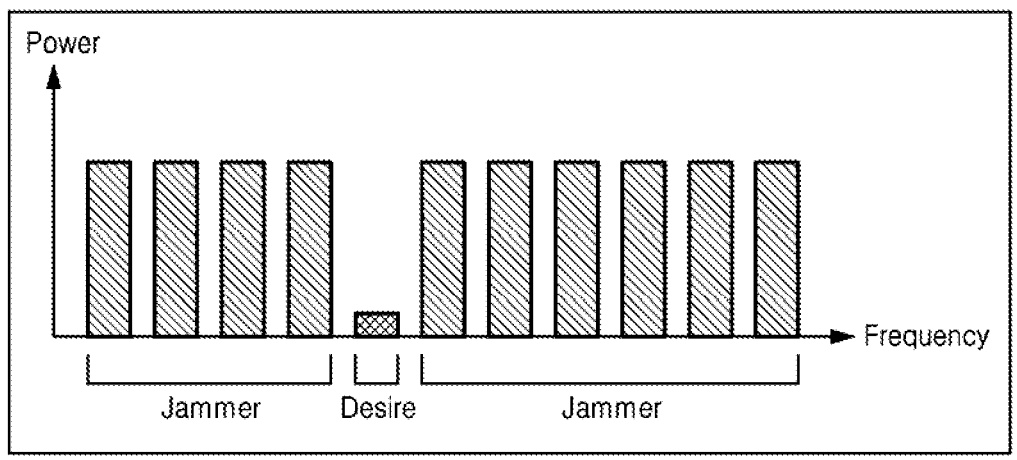
FIG. 2 shows a channel environment of a low-noise amplifier (LNA) in accordance with one embodiment of the present invention.

FIG. 2 shows a channel environment of a low-noise amplifier (LNA) in accordance with one embodiment of the present invention.

In the embodiment of channel environment of mobile TV tuner shown in FIG. 2, because the power of the desired-channel is small and the power of the surrounding channel is large, in order to improve the power problem, it is desired that the harmonic tone of the surrounding channel improves the linearity performance of the low-noise amplifier (LNA) without affecting the desired-channel.

Figure 3A:
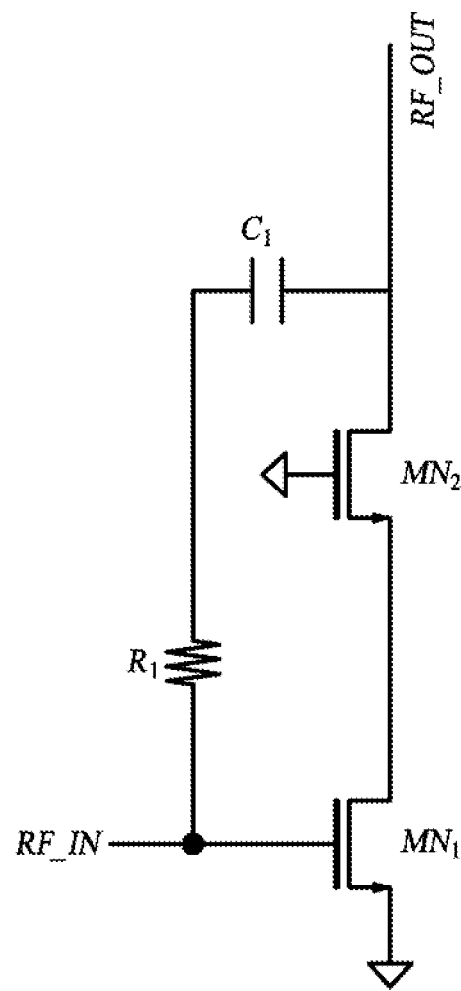
FIG. 3a shows a circuit of a conventional LNA core.
Figure 3B:
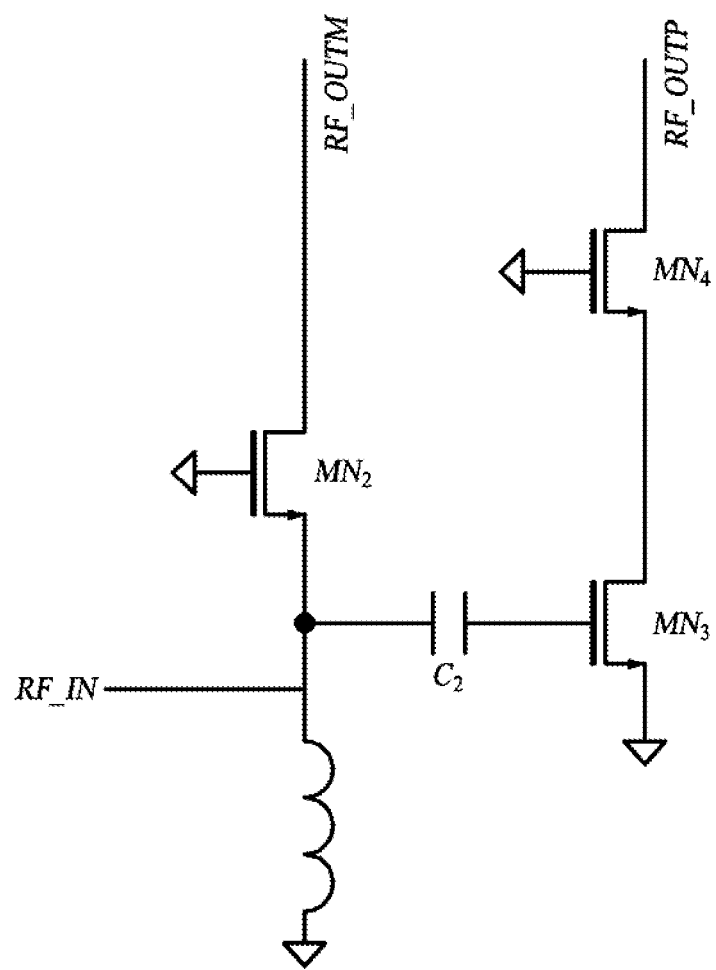
FIG. 3b shows a circuit of a conventional LNA core.

FIGS. 3a and 3b show a circuit of a conventional LNA core.

A structure of a common CS (Common Source) low-noise amplifier (LNA) is shown in FIG. 3a. The low-noise amplifier (LNA) shown in FIG. 3a is a CS (Common Source) amplifier having an RC feedback, which is used as a common low-noise amplifier. As a structure frequently used, the common low-noise amplifier (LNA) has a very good function of noise figure (NF).

The CS low-noise amplifier (LNA) shown in FIG. 3a comprises a first amplification circuit, a second amplification circuit, and an RC feedback circuit.

The first amplification circuit includes a first amplifier ($MN_1$) and a second amplifier ($MN_2$). The first amplifier ($MN_1$) and the second amplifier ($MN_2$) are connected in series. The first amplifier ($MN_1$) includes a first input terminal, a first current lead-in unit, and a first current lead-out unit. The first input terminal is connected to an input terminal (RF_IN). The first current lead-in unit is connected to the second amplifier (MN2). The first current lead-out unit is connected to the ground.

The second amplifier ($MN_2$) includes a second input terminal, a second current lead-in unit, and a second current lead-out unit. The second input terminal is connected to the ground. The second current lead-in unit is connected to an output terminal (RF_OUT). The second current lead-out unit is connected to a first capacitor ($C_1$).

RC feedback circuit includes a first resistor ($R_1$) and the first capacitor ($C_1$). The first resistor ($R_1$) and the first capacitor ($C_1$) are connected in series. One end of the RC feedback circuit is connected to the input terminal (RF_IN), and the other end of the RC feedback circuit is connected to the output terminal (RF_OUT). One end of the first resistor ($R_1$) is connected to a contact point of the input terminal (RF_IN) with the first input terminal. The other end of the first resistor ($R_1$) is connected to one end of the first capacitor ($C_1$). One end of the first capacitor ($C_1$) is connected to the other end of the first resistor ($R_1$). The other end of the first capacitor ($C_1$) is connected to a contact point of the second current lead-in unit with the output terminal (RF_OUT).

The structure of a common CSCG (Common Source Common Gate) low-noise amplifier (LNA) is shown in FIG. 3. In order to generate differential output, as shown in FIG. 3b, it is necessary to add a differential amplifier with CSCG (Common Source Common Gate) form. The circuit shown in FIG. 3b can improve the noise figure (NF) of the mixer by the application for generating differential output in the next stage of common low-noise amplifier (LNA) and the function of pre-amplifier of the mixer. When the structure shown in FIG. 3b is used as a low-noise amplifier (LNA), in order to match the pulse signal (S11) no higher than 10 dB, it is necessary to set CG (Common Gate) amplifier at $1/gm=50\Omega$, and the function of noise figure (NF) will degrade when noise figure (NF) is larger than 2.8 dB.

The CSCG low-noise amplifier (LNA) shown in FIG. 3b comprises a first amplification circuit, a second amplification circuit, and an RC feedback circuit.

The first amplification circuit includes a second amplifier ($MN_2$). The second amplifier ($MN_2$) includes a second input terminal, a second current lead-in unit, and a second current lead-out unit. The second input terminal is connected to the ground. The second current lead-in unit is connected to an output terminal (RF_OUTM). The second current lead-out unit is connected to one end of the second capacitor ($C_2$), input terminal (RF_IN), and one end of an inductor. The other end of the inductor is connected to the ground.

The second amplification circuit includes a third amplifier ($MN_3$) and a fourth amplifier ($MN_4$). The third amplifier ($MN_3$) and the fourth amplifier ($MN_4$) are connected in series. The third amplifier ($MN_3$) includes a third input terminal, a third current lead-in unit, a third current lead-out unit. The third input terminal is connected to the other end of the second capacitor ($C_2$). The third current lead-in unit is connected to the fourth current lead-out unit. The third current lead-out unit is connected to the ground. The fourth amplifier ($MN_4$) includes a fourth input terminal, a fourth current lead-in unit, a fourth current lead-out unit. The fourth input terminal is connected to the ground. The fourth current lead-in unit is connected to the output terminal (RF_OUTP). The fourth current lead-out unit is connected to the third current lead-in unit.

One end of the second capacitor ($C_2$) is connected to the first amplification circuit, and the other end of the second capacitor ($C_2$) is connected to the second amplification circuit. One end of the second capacitor ($C_2$) is connected to the second current lead-out unit of the second amplifier ($MN_2$); the other end of the second capacitor ($C_2$) is connected to the third input terminal of the third amplifier ($MN_3$).

Figure 3C:
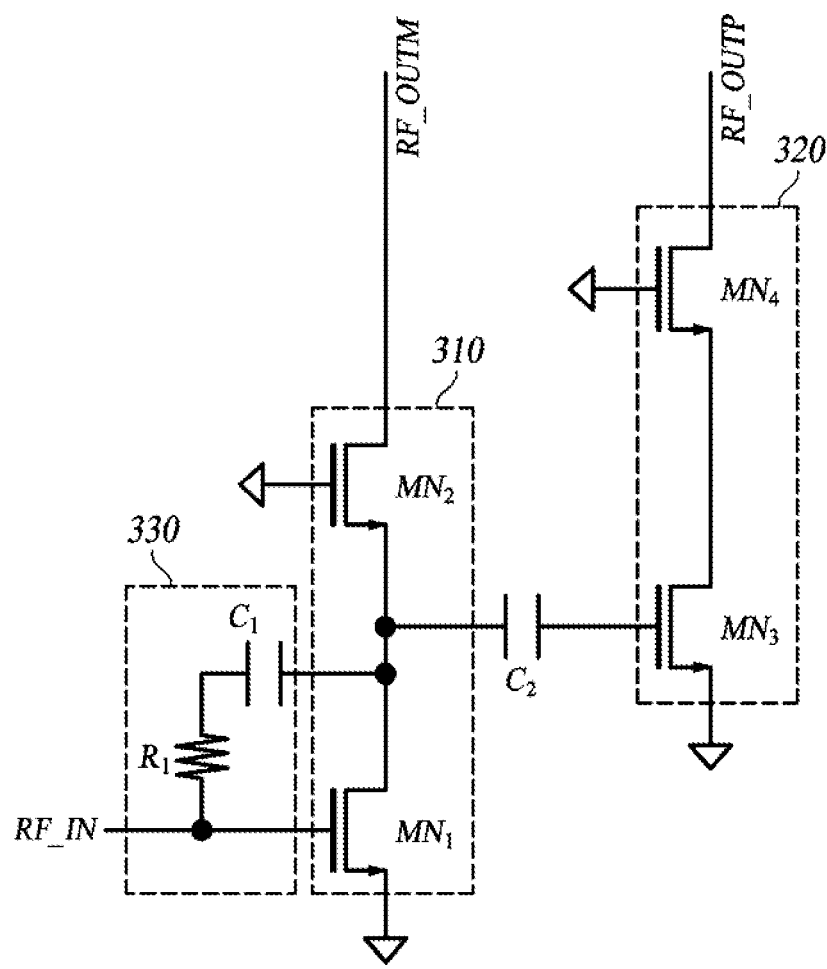
FIG. 3c shows a circuit of LNA core in accordance with one embodiment of the present invention.
Figure 3D:
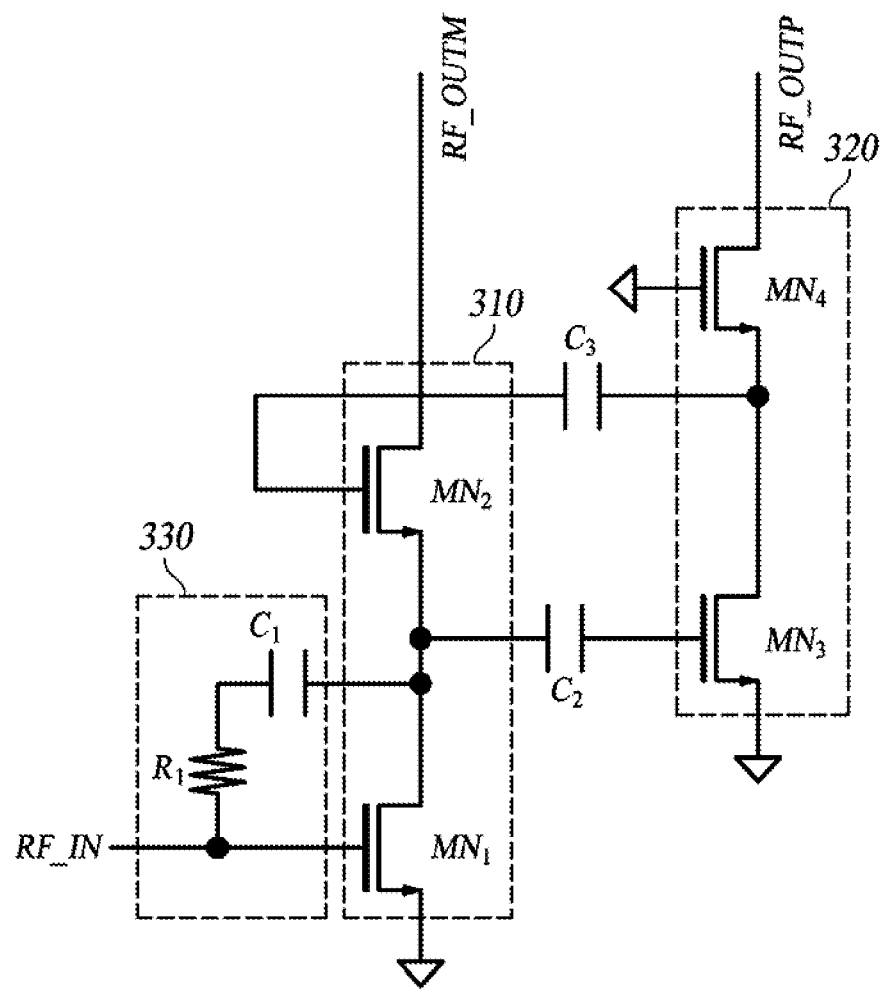
FIG. 3d shows a circuit of LNA core in accordance with one embodiment of the present invention.

FIG. 3c and FIG. 3d show a circuit of LNA core in accordance with one embodiment of the present invention.

FIG. 3c shows a structure of balun low-noise amplifier (LNA) in accordance with one embodiment of the present invention. As shown in FIG. 3c, there is a low-noise amplifier (LNA) structure with a noise figure (NF)=1.4 dB level, in which a CS amplifier is used as a '1-stage' low-noise amplifier (LNA), the current output of the first N-type amplifier ($MN_1$) is RC fed-back and the IM3 (Third Inter-Modulation) high harmonic component is canceled, to improve the linearity. A low-noise amplifier (LNA) of balun form can be made by using a CSCG amplifier at '2-stage' to the output of the '1-stage' CS low-noise amplifier (LNA). Because in the low noise amplifier (LNA) of balun form, l/gm of CG portion ($MN_2$) is not limited within '50Ω' like the circuit shown in FIG. 3b, it is designed to have a low impedance and reduces the current swing at the output node of $MN_1$, thus linearity can be improved.

The low-noise amplifier (LNA) shown in FIG. 3c comprises a first amplification circuit (310), a second amplification circuit (320), an RC feedback circuit (330), and a capacitor (C2).

The first amplification circuit (310) applies a driving signal and output the amplified amplification signal. The first amplification circuit (310) includes a first amplifier ($MN_1$) and a second amplifier ($MN_2$). The first amplifier ($MN_1$) and the second amplifier ($MN_2$) are connected in series. The first amplifier ($MN_1$) includes a first input terminal, a first current lead-in unit, and a first current lead-out unit. The first input terminal is connected to a first resistor ($R_1$), the first current lead-in unit is connected to a first capacitor ($C_1$), and the first current lead-out unit is connected to the ground. The second amplifier ($MN_2$) includes a second input terminal, a second current lead-in unit, and a second current lead-out unit. The second input terminal is connected to the ground, the second current lead-in unit is connected to an output terminal, and the second current lead-out unit is connected to one end of the second capacitor ($C_2$).

The second amplification circuit (320) applies an amplification signal and output the amplified output signal. The second amplification circuit (320) includes a third amplifier ($MN_3$) and a fourth amplifier ($MN_4$). The second amplification circuit (320) is connected to the third amplifier ($MN_3$) and the fourth amplifier ($MN_4$) in series. The third amplifier ($MN_3$) includes a third input terminal, a third current lead-in unit, a third current lead-out unit. The third input terminal is connected to the other end of the second capacitor ($C_2$), the third current lead-in unit is connected to the other end of the third capacitor ($C_3$), and the third current lead-out unit is connected to the ground.° The fourth amplifier ($MN_4$) includes a fourth input terminal, a fourth current lead-in unit, a fourth current lead-out unit. The fourth input terminal is connected to the ground, the fourth current lead-in unit is connected to the output terminal, and the fourth current lead-out unit is connected to the other end of the third capacitor ($C_3$).

RC feedback circuit (330) includes the first resistor ($R_1$) and the first capacitor ($C_1$). The first resistor ($R_1$) and the first capacitor ($C_1$) are connected in series. One end of the RC feedback circuit (330) is connected to the input terminal (RF_IN) and the input terminal of the first amplifier ($MN_1$). The other end of the RC feedback circuit (330) is connected to a contact point between the first amplifier ($MN_1$) and said second amplifier ($MN_2$).

One end of the second capacitor ($C_2$) is connected to a contact point of the first amplifier ($MN_1$) with the second amplifier ($MN_2$); the other end is connected to the input terminal of the third amplifier ($MN_3$).

FIG. 3d shows a low-noise amplifier (LNA) structure of balun form, which employs a scheme for improving the linearity in the structure shown in FIG. 3c.

In FIG. 3d, through feedbacking the output node of the third N-type amplifier ($MN_3$) from the low-noise amplifier (LNA) structure of FIG. 3c to the gate of the second N-type amplifier ($MN_2$), IM3 (Third Inter-Modulation) can be removed even in CSCG. The circuit shown in FIG. 3d adopts the low-noise amplifier (LNA) structure of each band in the structure shown in FIG. 1, and 'RF_OUTM' and 'RF_OUTP' are shared by LNA core (120). Band of each low-noise amplifier (LNA) can be set as a band used according to the LC value that is shared by the outputs of the input matching and the low-noise amplifier (LNA). In the case of CATV, because it is necessary to support the wideband, the value of the first resistor ($R_1$) is set to be smaller than the other low-noise amplifier (LNA), and is subjected to wide-matching.

The low-noise amplifier (LNA) shown in FIG. 3d comprises a first amplification circuit (310), a second amplification circuit (320), an RC feedback circuit (330), a second capacitor ($C_2$), and a third capacitor ($C_3$).

The first amplification circuit applies a driving signal and output the amplified amplification signal. The first amplification circuit (310) includes a first amplifier ($MN_1$) and a second amplifier ($MN_2$). The first amplifier ($MN_1$) and the second amplifier ($MN_2$) are connected in series. The first amplifier ($MN_1$) includes a first input terminal, a first current lead-in unit, and a first current lead-out unit. The first input terminal is connected to a first resistor ($R_1$), the first current lead-in unit is connected to a first capacitor ($C_1$), and the first current lead-out unit is connected to the ground. The second amplifier ($MN_2$) includes a second input terminal, a second current lead-in unit, and a second current lead-out unit. The second input terminal is connected to the ground, the second current lead-in unit is connected to an output terminal, and the second current lead-out unit is connected to one end of the second capacitor ($C_2$).

The second amplification circuit (320) applies an amplification signal and output the amplified output signal. The second amplification circuit (320) includes a third amplifier ($MN_3$) and a fourth amplifier ($MN_4$). The second amplification circuit (320) is connected to the third amplifier ($MN_3$) and the fourth amplifier ($MN_4$) in series. The third amplifier ($MN_3$) includes a third input terminal, a third current lead-in unit, a third current lead-out unit. The third input terminal is connected to the other end of the second capacitor ($C_2$), the third current lead-in unit is connected to the other end of the third capacitor ($C_3$), and the third current lead-out unit is connected to the ground. The fourth amplifier ($MN_4$) includes a fourth input terminal, a fourth current lead-in unit, a fourth current lead-out unit. The fourth input terminal is connected to the ground, the fourth current lead-in unit is connected to the output terminal, and the fourth current lead-out unit is connected to the other end of the third capacitor ($C_3$).

RC feedback circuit (330) includes the first resistor ($R_1$) and the first capacitor ($C_1$). The first resistor ($R_1$) and the first capacitor ($C_1$) are connected in series. One end of the RC feedback circuit (330) is connected to the input terminal (RF_IN) and the input terminal of the first amplifier ($MN_1$). The other end of the RC feedback circuit (330) is connected to a contact point of the first amplifier ($MN_1$) of the second amplifier ($MN_2$).

One end of the second capacitor ($C_2$) is connected to a contact point of the first amplifier ($MN_1$) with the second amplifier ($MN_2$); the other end is connected to the input terminal of the third amplifier ($MN_3$). One end of the third capacitor ($C_3$) is connected to the input terminal of the second amplifier (MN2); the other end is connected to a contact point of the third amplifier ($MN_3$) with the fourth amplifier ($MN_4$). The output signal of the second amplification circuit (320) is feedbacked to the input terminal of the second amplifier ($MN_2$) via the third capacitor ($C_3$).

The above description is only described to illustrate the technical concept of the embodiments of the present invention. Those skilled in the art can make various modifications and variations without departing from the scope of the essential features of the embodiments of the present invention. Therefore, the embodiments of the present invention are not intended to limit the technical idea of the present invention, but for the purpose of describing. The scope of the technical idea of the present invention is not limited to these embodiments. The protection scope of the embodiments of the present invention should be interpreted by the scope of the claims, and all of the technical ideas within the equivalent scope should be interpreted as being included in the protection scope of the embodiments of the present invention.

EXPLANATION OF REFERENCE SYMBOLS

108 input port
110 signal input unit
120 LNA core
122 amplifying unit
130 mixer

What is claimed is:

1. A low-noise amplifier, comprising:
   a first amplification circuit, including a first amplifier ($MN_1$) and a second amplifier ($MN_2$) which are connected in series;
   a second amplification circuit, including a third amplifier ($MN_3$) and a fourth amplifier ($MN_4$) which are connected in series;
   an RC feedback circuit, including a first resistor ($R_1$) and a first capacitor ($C_1$) connected in series, with one end connected to an input terminal (RF_IN) and the other end connected to a contact point of said first amplifier ($MN_1$) with said second amplifier ($MN_2$); and
   a second capacitor (C2), with one end directly connected to the contact point of said first amplifier ($MN_1$) with said second amplifier ($MN_2$), the other end directly connected to an input terminal of said third amplifier ($MN_3$),
   wherein, said first amplification circuit is applied with a driving signal of specified region with multi-band, and outputs an amplified amplification signal, said second amplification circuit is applied with an amplification signal, and outputs an amplified output signal,
   wherein only the first amplification circuit receives the driving signal of specified region with multi-band.

2. The low-noise amplifier according to claim 1, further comprising a third capacitor (C3) in which one end connected to said second amplifier ($MN_2$), and the other end connected to a contact point between said third amplifier ($MN_3$) and said fourth amplifier ($MN_4$), wherein said output signal is feedbacked from said second amplifier ($MN_2$).

3. The low-noise amplifier according to claim 1, wherein,
   said first amplifier ($MN_1$) comprises a first input terminal, a first current lead-in unit, and a first current lead-out unit, in which said first input terminal is connected to said first resistor ($R_1$), said first current lead-in unit is connected to said first capacitor ($C_1$), and said first current lead-out unit is connected to the ground,
   said second amplifier ($MN_2$) comprises a second input terminal, a second current lead-in unit, and a second current lead-out unit, in which said second input terminal is connected to the ground, said second current lead-in unit is connected to an output terminal, and said second current lead-out unit is connected to one end of said second capacitor ($C_2$).

4. The low-noise amplifier according to claim 2, wherein, said third amplifier ($MN_3$) comprises a third input terminal, a third current lead-in unit, and a third current lead-out unit, in which said third input terminal is connected to the other end of said second capacitor ($C_2$), said third current lead-in unit is connected to the other end of said third capacitor ($C_3$), and said third current lead-out unit is connected to the ground, said fourth amplifier ($MN_4$) comprises a fourth input terminal, a fourth current lead-in unit, and a fourth current lead-out unit, in which said fourth input terminal is connected to the ground, said fourth current lead-in unit is connected to an output terminal, and said fourth current lead-out unit is connected to the other end of said third capacitor ($C_3$).

* * * * *